US010256202B1

(12) United States Patent
Spry et al.

(10) Patent No.: US 10,256,202 B1
(45) Date of Patent: Apr. 9, 2019

(54) DURABLE BOND PAD STRUCTURE FOR ELECTRICAL CONNECTION TO EXTREME ENVIRONMENT MICROELECTRONIC INTEGRATED CIRCUITS

(71) Applicant: The United States of America as represented by the Administrator of NASA, Washington, DC (US)

(72) Inventors: David J. Spry, Medina, OH (US); Dorothy Lukco, Sagamore Hills, OH (US); Philip G. Neudeck, Olmsted Township, OH (US); Carl W. Chang, Westlake, OH (US); Liangyu Chen, Cleveland, OH (US); Roger D. Meredith, Cleveland, OH (US); Kelley M. Moses, Cleveland, OH (US); Charles A. Blaha, North Royalton, OH (US); Jose M. Gonzalez, Fort Walton Beach, FL (US); Glenn M. Beheim, Hiram, OH (US); Kimala L. Laster, Cleveland, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 15/880,139

(22) Filed: Jan. 25, 2018

Related U.S. Application Data

(60) Provisional application No. 62/450,275, filed on Jan. 25, 2017.

(51) Int. Cl.
*H01L 23/48* (2006.01)
*H01L 23/52* (2006.01)
(Continued)

(52) U.S. Cl.
CPC .......... *H01L 24/05* (2013.01); *H01L 23/5226* (2013.01); *H01L 23/53257* (2013.01); *H01L 2224/05009* (2013.01); *H01L 2224/05015* (2013.01); *H01L 2224/05084* (2013.01); *H01L 2224/05169* (2013.01); *H01L 2224/05178* (2013.01); *H01L 2224/05181* (2013.01); *H01L 2224/05187* (2013.01);
(Continued)

(58) Field of Classification Search
CPC ................ H01L 24/05; H01L 23/5226; H01L 23/53237; H01L 2224/05009; H01L 2224/05015; H01L 2224/05084; H01L 2224/05169; H01L 2224/05178; H01L 2224/05181; H01L 2224/05187; H01L 2224/05193; H01L 2224/05644; H01L 2924/04642; H01L 2924/0475; H01L 2924/10272; H01L 2924/3512
USPC ............................................ 257/77, 76, 773
See application file for complete search history.

(56) References Cited

U.S. PATENT DOCUMENTS

3,812,521 A    5/1974   Davis et al.
5,942,448 A    8/1999   White
(Continued)

*Primary Examiner* — Cuong Q Nguyen
*Assistant Examiner* — Tong-Ho Kim
(74) *Attorney, Agent, or Firm* — Robert H. Earp, III; William M. Johnson (57) ABSTRACT

A durable bond pad structure is described that facilitates highly durable electrical connections to semiconductor microelectronics chips (e.g., silicon carbide (SiC) chips) to enable prolonged operation over very extreme temperature ranges.

17 Claims, 5 Drawing Sheets

(51) Int. Cl.
   *H01L 27/00*    (2006.01)
   *H01L 23/00*    (2006.01)
   *H01L 23/522*   (2006.01)
   *H01L 23/532*   (2006.01)

(52) U.S. Cl.
   CPC ............... *H01L 2224/05193* (2013.01); *H01L 2224/05644* (2013.01); *H01L 2924/0475* (2013.01); *H01L 2924/04642* (2013.01); *H01L 2924/10272* (2013.01); *H01L 2924/3512* (2013.01)

(56) References Cited

U.S. PATENT DOCUMENTS

| | | | |
|---|---|---|---|
| 6,319,757 B1 | 11/2001 | Parsons et al. | |
| 6,426,555 B1 | 7/2002 | Hsia et al. | |
| 6,845,664 B1 | 1/2005 | Okojie | |
| 6,989,574 B2 | 1/2006 | Parsons | |
| 7,397,125 B2 | 7/2008 | Oda | |
| 7,872,357 B2 | 1/2011 | Yu et al. | |
| 7,935,601 B1 * | 5/2011 | Neudeck | H01L 21/0465 438/186 |
| 8,723,325 B2 | 5/2014 | Chen et al. | |
| 8,994,181 B2 | 3/2015 | Chen et al. | |
| 9,013,002 B1 * | 4/2015 | Spry | H01L 23/485 257/382 |
| 9,105,588 B2 | 8/2015 | Chen et al. | |
| 9,269,678 B2 | 2/2016 | Wang | |
| 9,437,574 B2 | 9/2016 | Tran et al. | |
| 9,691,703 B2 | 6/2017 | Wang | |
| 2005/0048772 A1 | 3/2005 | Pan | |
| 2005/0275096 A1 | 12/2005 | Zeng et al. | |
| 2017/0098647 A1 * | 4/2017 | Uchida | H01L 27/0629 |

* cited by examiner

DURABLE BOND PAD STRUCTURE FOR ELECTRICAL CONNECTION TO EXTREME ENVIRONMENT MICROELECTRONIC INTEGRATED CIRCUITS

CROSS-REFERENCE TO RELATED APPLICATIONS

This application claims the benefit of U.S. Provisional Patent Application Ser. No. 62/450,275 entitled "Durable Bond Pad Structure for Electrical Connection to Extreme Environment Microelectronic Integrated Circuits" filed on Jan. 25, 2017, the entirety of which is incorporated herein by reference.

ORIGIN OF THE INVENTION

The invention described herein was made in the performance of work under a NASA contract and is subject to the provisions of Section 305 of the National Aeronautics and Space Act, Public Law 111-314, § 3 (124 Stat. 3330, 51 U.S.C. Chapter 201).

BACKGROUND

Integrated circuit (IC) chips provide for electrical connections to/from their circuitry via specialized structures known as "bond pads" that reside on the IC. These bond pads typically have sufficient areas (e.g., dimensions typically greater than 50 micrometer by 50 micrometers, relatively large areas compared to other features on the chip) of exposed metal that facilitate conductive physical attachment of either conductive metal wires or conductive metal trace features which electrically connect the chip to its package and off-chip circuitry (including the external electric power the chip needs to operate).

Figure 1A:
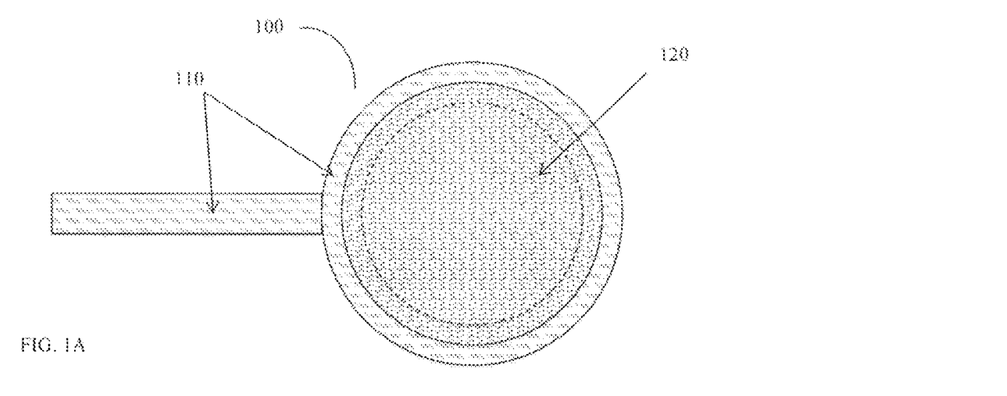
FIG. 1A is a top view schematic of a prior art bond pad configuration.
Figure 1B:
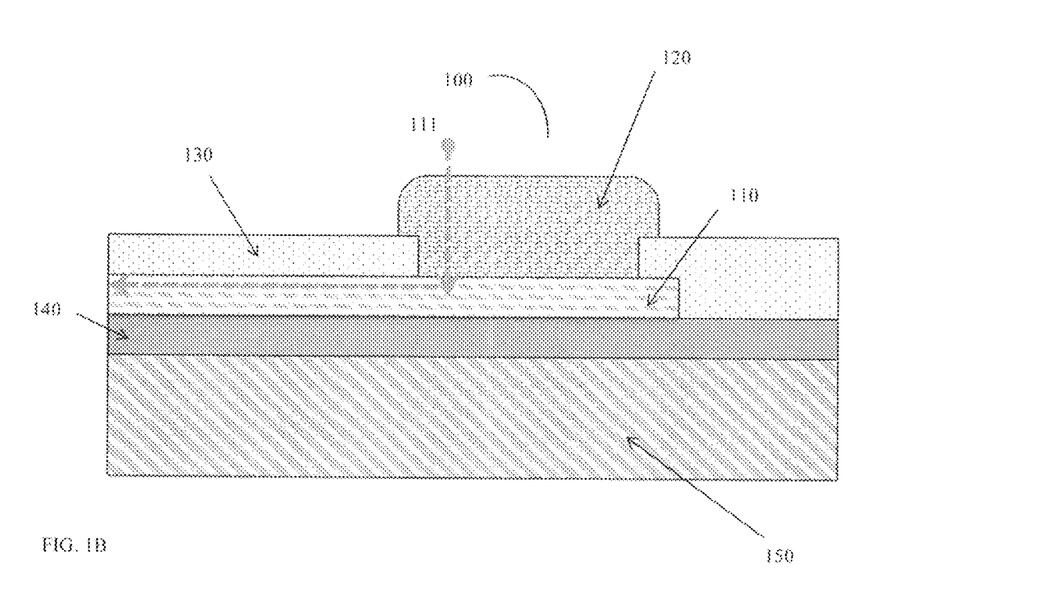
FIG. 1B is a side view cross section schematic of a prior art bond pad configuration.

FIG. 1 depicts a prior art bond pad structure suitable for the attachment of small wire to bond pad via physical "wire bonding" that is known in the art. The electrical signal flows through the wire, through the physically bonded joint with the bond pad, and then through the bond pad thickness to thin film patterned metal interconnect into the rest of the integrated circuit. Typically, the bond pad metal film is thicker than the thickness of other metal films in the IC to protect the underlying dielectric from damage incurred during the probe-testing and wire bonding process.

The prior art bond pad 120 resides on top of an insulating dielectric layer 140 as shown in FIGS. 1A and 1B that serves to electrically isolate the physical bond pad from the semiconductor chip 150 except through electrical connection to the metal layer 110 to elsewhere on the chip than the lateral bond pad region. As is known in the art, often the first semiconductor devices in the electrical signal path between the bond pad and the rest of the chip circuitry is a device structure that provides protection of the IC from electrostatic discharge (ESD) that can often occur as electronics are further handled and assembled into larger systems. In some prior art cases, the bond pad may be part of the ESD protection device. While there is abundant prior art that describes thin-film IC bond pads suitable for operation of conventional ICs designed to function over normal electronics temperature ranges (i.e., about −55° C. to about 125° C.), prior art bond pads fail to meet the highly challenging demands imposed by greatly expanding the peak operational temperature to 500° C. and beyond. In particular, the materials and structures employed in conventional IC bond pads cannot durably withstand extreme IC temperature ranges (−55° C. to 500° C.) without severe physical damage and degradation that impede desired electrical functionality (conductivity) of the bond pad structure. For example, the greatly increased temperature range imposes larger physical stresses on metal and insulator thin-film stack/structure used to form prior-art bond pad structures (such as FIGS. 1A and 1B) because the metal thin film(s) and dielectric thin film(s) have differing thermal expansion properties (i.e., different coefficients of thermal expansion (CTE)). These thermally-sensitive stress forces build across the relatively large-area interface between the wire bonding metal and insulator until one of the films suffers irreversible physical damage in the form of cracks, buckling, or de-lamination that degrades the bond pad electrical functionality. In silicon, creep of the semiconductor itself under stress and temperature can also occur leading to bond pad degradation and failure. Another failure mechanism that becomes more active at higher temperatures is oxidation of the metal and sensitive metal-to-metal or metal-to-semiconductor interfaces, which typically turns desirably conductive IC bond pad into undesirably non-conductive metal oxide. When oxygen reaches stressed interfaces of dissimilar materials through a crack in the protective dielectric, lateral enhancement/acceleration of oxidation along the interface and resulting degradation of electrical conduction properties can occur leading to accelerated device failure. While there are many different variants of conventional bond pads in the prior art, they are all susceptible to similar damage mechanisms as IC operational temperature ranges are expanded to reach towards 500° C. and beyond operating temperatures.

SUMMARY

The following presents a simplified summary in order to provide a basic understanding of some aspects of the innovation. This summary is not an extensive overview of the innovation. It is not intended to identify key/critical elements or to delineate the scope of the innovation. Its sole purpose is to present some concepts of the innovation in a simplified form as a prelude to the more detailed description that is presented later.

The present invention relates to the electrical connection of very extreme temperature semiconductor microelectronics integrated circuit (IC) chips with packages that both protect the chips from damage and electrically connect said chips to other circuits and electrical components/subsystems/systems.

According to an aspect, the innovation disclosed is a durable bond pad structure. In one embodiment, the durable bond pad structure according to the innovation may comprises a bond pad metal stack having an interface in direct physical, mechanical, and, conductive electrical contact with an interface of a conductive region of a semiconductor. The durable bond pad structure may further include a first (lower) insulating dielectric layer comprising at least one patterned via, wherein the first (lower) insulating dielectric layer is in contact with the outside lateral interface of the bond pad metal stack and also in contact with the conductive region of the semiconductor.

In one embodiment, the durable pond pad structure may further include at least one electrically conductive metal layer that is not in physical contact with the bond pad metal stack, but is in electrical and physical contact through the at least one patterned via with the conductive region of the semiconductor. An electrical signal path flows through the bond pad metal stack, the conductive region of the semiconductor, and through the at least one metal layer that carries electrical signals to/from semiconductor devices and circuits residing elsewhere on the same semiconductor chip.

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

DETAILED DESCRIPTION

According to an aspect of the innovation, a bond pad structure is disclosed that may be used for integrated circuits that function for prolonged time in extreme temperatures. In one embodiment, the bond pad structure may be directly attached to the semiconductor. In one embodiment, the conductive bond pad metal stack may be directly attached to a conductive region/layer of the semiconductor. The conductive portion/layer of the semiconductor may be a layer of silicon carbide (SiC). The typical prior art bond pad structure included bond pad metal attached to a dielectric layer between the bond pad metal and the semiconductor as depicted in FIGS. 1A and 1B.

It was discovered that attaching the bond pad metal to a dielectric layer between the pad metal and semiconductor provides for inferior mechanical adhesion making the relatively thicker metal bond pad film susceptible to damage from CTE mismatch stress especially imparted by operation across extreme temperature ranges. It was also discovered that superior mechanical adhesion is obtained by directly depositing the bond pad onto the mechanically strong and flat semiconductor (e.g., SiC semiconductor). The extremely flat/smooth semiconductor surface foundation improves the flatness/smoothness of the subsequently deposited bond pad metal films, which in turn can facilitate improved/easier wire bonding and bond durability and strength.

According to an aspect, the structure according to the innovation reduces the impact of physical dielectric crack formation—if and when it occurs due to large thermally-induced stress—to regions where there are no oxygen-sensitive metals or metal interfaces. This simultaneously allows thermally-induced film stress (which can be significant for extreme temperature operating ranges) to be relieved without the cracking exposing the oxygen-sensitive metal layers and oxygen-sensitive metal-SiC interfaces to air, directly or via interfacial lateral enhanced diffusion path. Such exposure leads to device operation degradation. Cracks that penetrate from the dielectric surface to the SiC surface without contacting or passing through metals, on the other hand, do not impact device functionality. Also, the direct connection of the bonding metallization to the pristine and flat and extra-hard SiC surface (rendered by final wet etch of dielectric just prior to deposition) provides maximum adhesion and mechanical strength for the bond pad to better withstand bonding and thermal-stress forces with reduced damage/degradation. This structure also promotes durability and repeatability because the bond pad stack metal film interfaces and surfaces have a smooth microscopic morphology. As described below, the bond pad design according to the innovation has been tested and shown thousands of hours of operation at 500° C.

In one embodiment, the conductive layer of the semiconductor is a microscopically flat/smooth, mechanically extremely hard, and conductive region of a silicon carbide (SiC) single-crystal semiconductor.

In one embodiment, the bond pad may be laterally patterned as an isolated island of metal that is not in direct physical contact with any other patterned metal or interconnect. As depicted, for example, in FIGS. 2A and 2B, the bond pad metal stack 220 does not come in direct contact with the conductive interconnect (e.g., metal layer 210) that carries electrical signal between the bond pad and the rest of the integrated circuitry residing on the semiconductor chip. In this embodiment, the bond pad metal 220 is completely laterally surrounded by layers of dielectric (e.g., layers 230, 240). In some embodiments, insulating dielectric layers 230 and 240 may be comprised of the same dielectric insulating material, but lower dielectric layer 240 is deposited and suitably patterned in a separate processing step prior to the subsequent deposition and patterning of upper dielectric layer 230. In alternative embodiments, the upper dielectric layer 230 may be comprised of a different dielectric material than lower dielectric material 240. The upper dielectric layer 230 is configured so that it overcoats and protects conductive interconnect metal layer 210 from being exposed to atmospheric oxygen during extreme temperature operation that otherwise could oxidize and degrade metal layer 210 from performing its electrical function of conducting electrical signals. The lower dielectric layer 240 is configured with patterned etched vias 215 that enable metal layer 210 to directly contact and make electrical connection to the surface of conductive region 270. Portions of the bond pad metal 220 and the lower dielectric layer 240 and the metal layer 210 are adjacent to and in contact with at least a portion of the conductive region 270 of the semiconductor.

Figure 2A:
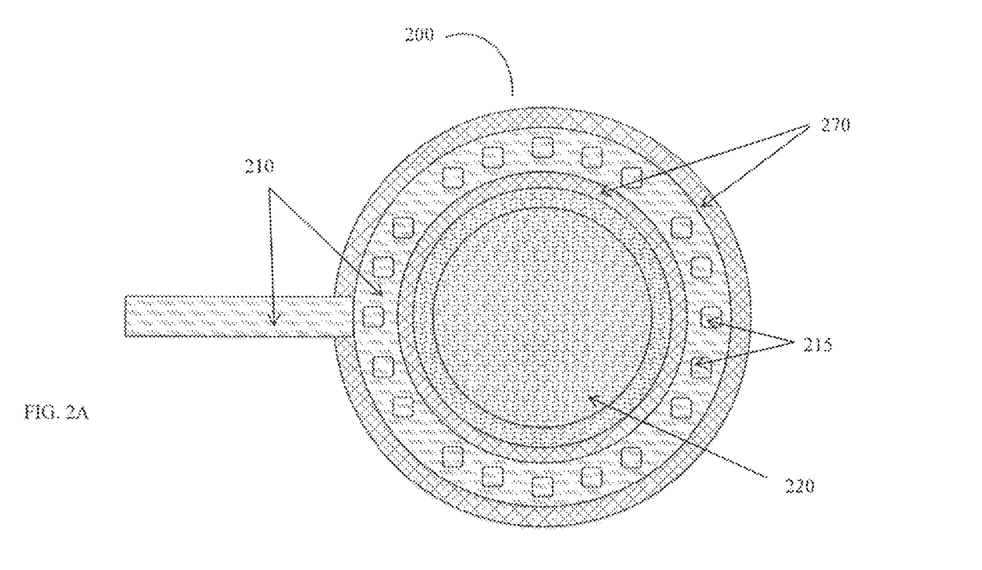
FIG. 2A is a top view schematic of a bond pad configuration according to an embodiment of the innovation.
Figure 2B:
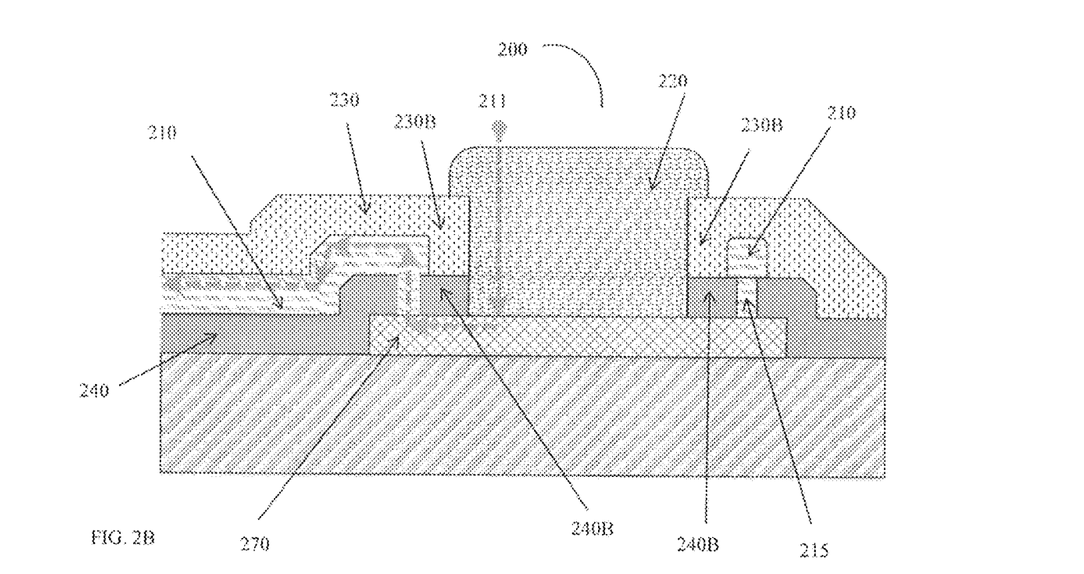
FIG. 2B is a side view cross section schematic of a bond pad configuration according to an embodiment of the innovation.

According to this embodiment of the innovation, the electrical signal must flow through the conductive region 270 of the semiconductor, as depicted by dashed arrows 211 in FIG. 2B. In conventional bond pad structures, patterned metal carrying electrical signals elsewhere within the IC physically contact/connect the bond pad metal (as seen in FIG. 1, electrical signal flow 111 only flows through metals).

In one embodiment, the dielectric laterally surrounding the bond pad metal (e.g., 230B and 240B) is itself completely laterally surrounded by a pattern of high-temperature interconnect metal 210. FIG. 2b depicts a cross-section showing an upper dielectric layer 230 and a lower dielectric layer 240. A portion of upper dielectric 230B is adjacent to bond pad metal 220 and metal layer 210. In some embodiments, such as the one depicted in FIG. 2B, the small portion of lower dielectric 240B that resides immediately adjacent to bond pad metal 220 is laterally surrounded by a ring of metal 210, and also contacts the conductive SiC layer 270 below and the SiC substrate 250.

In one embodiment, the lateral distance between the laterally enclosing metal ring 210 and bond pad island metal 220 is between 1× and 10× the wafer fabrication process lateral patterning minimum dimension (lambda, known in the art). In some embodiments, the latter distance between the bond pad 220 and metal ring 210 may be reduced. Reduction of the lateral distance between bond pad island 220 and metal ring 210 will improve the quantitative electrical performance by reducing the electrical series resistance of the bond pad structure. However, if this lateral distance is made too small it disadvantageously increases the chances that a crack formed in the dielectric might undesirably reach metal 210 which in turn would undesirably lead to oxidation and failure of metal 210 under hightemperature operation.

In one embodiment, the laterally enclosing metal is electrically connected to the bond pad metal through vias 215 through the lower oxide dielectric 240 overlying the outer lateral region of the conductive wide band gap semiconductor feature. As illustratively indicated by dashed arrow path 211 in e.g., FIG. 2B, the electrical signal flows down from the bond pad metal 220, into and then laterally through the conductive wide band gap semiconductor feature 270, then up into metal 210 residing inside/at oxide via 215 and then laterally through metal 210 to the rest of the integrated circuit (not shown). It is known in the art that the direction of electrical signal can also be reversed from the depiction shown in FIG. 2B (i.e., the arrow directions reversed, indicating opposite signal flow direction from the chip out of the bond pad) depending on electrical signal bias conditions and purpose.

In one embodiment, the conductive semiconductor layer 270 through which electrical signal flows is formed with first doping polarity (n-type or p-type, known in the art), and resides atop underlying semiconductor (e.g., an SiC semiconductor) region whose conductivity is intentionally made insulating or opposite-type from first doping polarity type via doping techniques known in the art.

According to an embodiment, the innovation may include a bond pad metal stack having multiple layers. In one embodiment, the bond pad metal stack may comprise or include an iridium interfacial stack ("IrIS"). In one embodiment, the layers of the bond metal stack may be arranged as follows:

| |
|---|
| Gold Layer |
| Upper Platinum Layer |
| Iridium Layer |
| Lower Platinum Layer |
| TaSi$_2$ Layer |
| Conductive SiC Layer |

In one embodiment, the bond pad metal stack may comprise the following layers (in order of deposition, from bottom contacting the SiC to top exposed bonding surface) 4000 Angstrom thick layer of TaSi$_2$, 2000 Angstrom thick layer of Platinum, 2000 Angstrom thick layer of Iridium, 2000 Angstrom thick layer of Platinum, ultrahigh vacuum sputter deposited in suitable sputter system to permit these layers to be deposited without breaking vacuum, capped by 1 micron thick gold deposited by vacuum E-beam evaporation. Sputter-deposited "IrIS" bond pad layers are disclosed in U.S. Pat. No. 9,013,002, which is incorporated herein in its entirety. Other bond pad metallization layer structures could be employed besides "IrIS", so long as they meet electrical and mechanical durability requirements for extreme temperature. Such requirements are described in detail in U.S. Pat. No. 9,013,002 and include ability to form strong bond wire attachment, the ability to conduct electrical signals for long (e.g., months or years in duration) exposures to 500° C. oxidizing air environment.

For example, the Ti/TaSi2/Pt metal contact stack described in Okojie, et al., "Reliability assessment of Ti/TaSi2Pt ohmic contacts on SiC after 1000 h at 600° C.," *J Appl. Phys.*, 91:10, pp. 6553-6559 (2002), which is incorporated herein in its entirety. In one embodiment, the total thickness of the bond pad stack is less than 2 micrometers as thinner stacks desirably reduce top metal surface roughness and can be deposited more quickly in mass-production. Thicknesses of such stacks can suitably range between about 0.2 micrometers to about 20 micrometers, about 0.5 micrometers to about 15 micrometers, about 0.75 micrometers to about 10 micrometers, about 1 micrometer to about 5 micrometers, or about 1 micrometer to about 4 micrometers. In one embodiment, the stacks have a thickness between about 1 micrometer to about 3 micrometers.

Figure 3A:
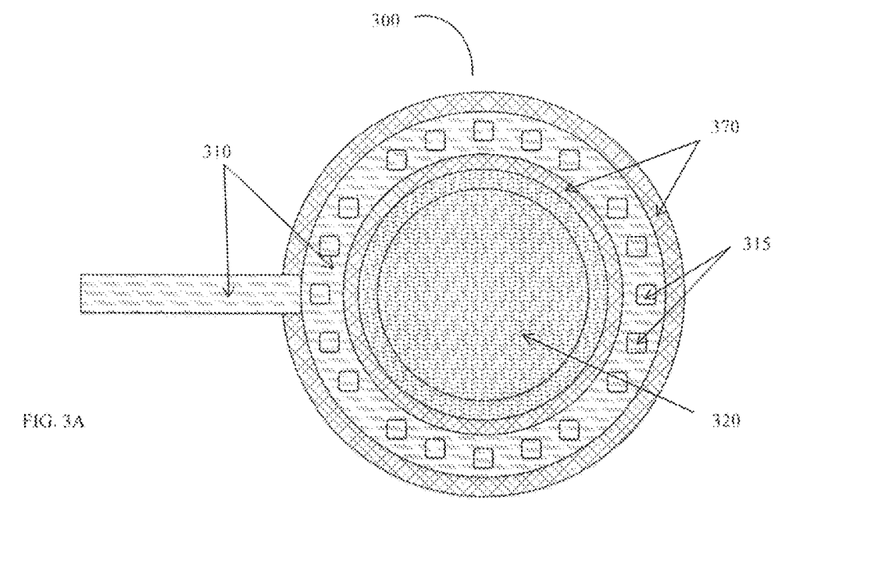
FIG. 3A is a top view schematic of a bond pad configuration according to an embodiment of the innovation.
Figure 3B:
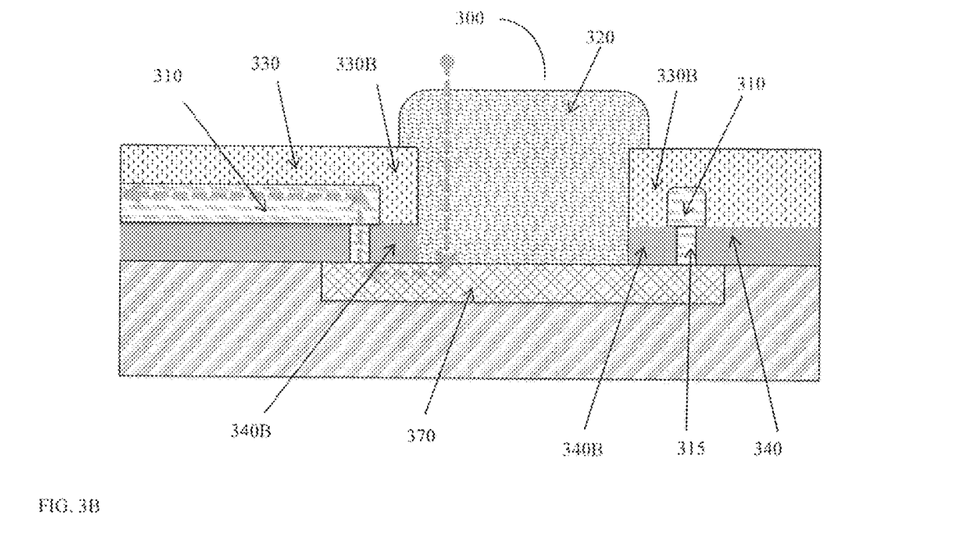
FIG. 3B is a side view cross section schematic of a bond pad configuration according to an embodiment of the innovation.
Figure 4:
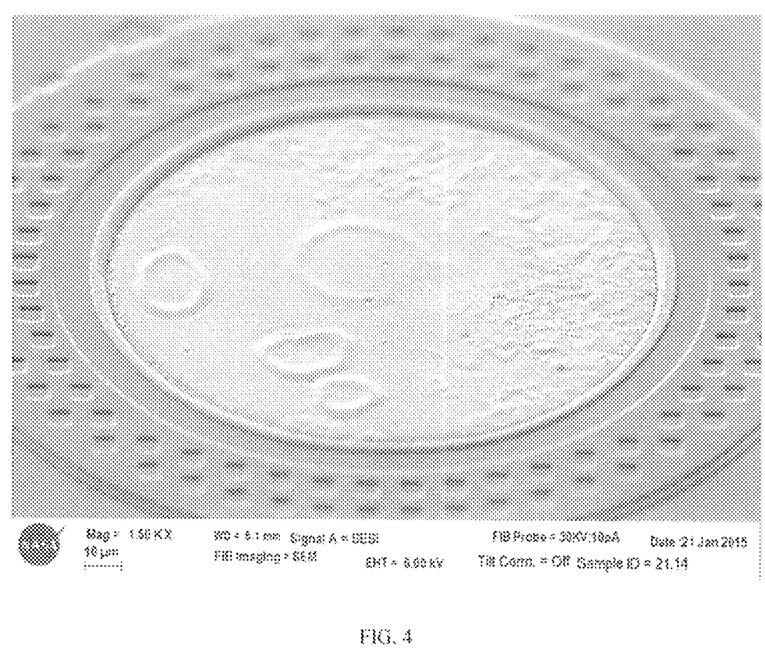
FIG. 4 is a photograph of an embodiment of the innovation recorded using scanning electron microscopy.

Turning now to FIGS. 2A and 2B and FIGS. 3A and 3B, embodiments of the present innovation are disclosed. The insulating dielectric layers cross-sections seen in FIGS. 2B and 3B are omitted from top-view depictions FIGS. 2A and 3A for clarity. According to the innovation, the bond metal stack (220, 320) is directly above and in contact with the conductive layer of semiconductor 270, 370 (e.g., a conductive SiC layer) and at least one insulating dielectric layer (e.g., 230, 240 or 330, 340).

According to these embodiments, the bond metal stack (220, 320) does not directly contact the metal layer 210. In one embodiment, the metal layer may comprise a high temperature refractory metal or metal alloy. The metal layer may possess a high melting temperature and high crystallization temperature. Suitable metals include elemental films and compounds and alloys of tantalum, silicon, carbon, aluminum, tungsten, molybdenum, nickel, titanium, hafnium, iridium, platinum, gold, silver, germanium, gallium, or a combination of two or more thereof.

As shown by the dashed arrows in FIGS. 2B and 3B, the electrical signal path, 211, 311 flows through the bond metal stack 220, 320, the conductive layer 270, 370, and then through metal layer 210, 310. As discussed above, the configuration in which the bond pad metal stack 220, 320 is attached to the semiconductor (conductive) layer 270, 370 provides for superior mechanical adhesion making the relatively thicker metal bond pad film less susceptible to damage from CTE mismatch stress. The extremely flat/smooth semiconductor surface foundation improves the flatness/smoothness of the subsequently deposited bond pad metal films, which in turn can facilitate improved/easier wire bonding and bond durability and strength.

The upper dielectric layer 230, 330 overcoats and protects/passivates interconnect metal 210, 310 from exposure to environmental impurities and atmosphere that could undesirably degrade device/circuit electrical properties. Such dielectric protection, also called passivation or a passivation layer, is well-known and practiced in the art of conventional integrated circuit manufacture, and is shown as element 130 in FIG. 1B. For extreme temperature integrated circuit operation, this layer performs the additional function of protecting interconnect from exposure to atmospheric oxygen that would otherwise cause oxidation at the extreme operating temperature and harm electrical conduction of interconnect metal (e.g., 210, 310). It is known in the art that most modern integrated circuits contain more than one layer of conductive interconnect. Typically, only one such metal interconnect layer is used to connect the bond pad to the rest of the integrated circuit.

This is in comparison to the bond pad structure of the prior art as depicted in FIGS. 1A and 1B that is used and sufficient for typical integrated circuits that operate over conventional electronics temperature below 200° C. As with FIGS. 2A and 3A, the dielectric layers in FIG. 1A is omitted for clarity. As depicted in FIG. 1B, the bond metal stack 120 is adjacent to and in contact with the metal layer 110. The electrical signal path 111 flows from the bond metal stack 120 through the metal layer 110. As noted above, this configuration may suffer from failure related to extreme temperature induced buckling and de-lamination of the metal 110 connected to bond pad metal 120 at/along the dielectric/metal interface. In particular, the adhesion of the metal film to the dielectric is insufficient to withstand the much larger stress buildup that arises due to CTE mismatch combined with the much larger temperature range of operation, and the relatively large lateral area of bond pads compatible with package connection techniques (wire bonding or flip-chip attachment) known in the art. The larger CTE mismatch stress buildup of higher temperature operation may sometimes also lead to crack formation/propagation of the upper protective dielectric passivation films. When cracks in upper dielectric 130 happen to form/propagate above interconnect metal 110, they provide a path for atmospheric oxygen to reach, oxidize, and fail the underlying metal interconnect 110 during high temperature operation.

According to an aspect of the innovation, a durable bond pad structure may be made for microelectronic integrated circuits in extreme environments, including extreme temperatures of 400° C. and above. In one embodiment, the structure includes a bond pad metal stack structure that includes multiple layers. In one embodiment, the bond pad metal stack may be formed in a deposition process that takes place near the end of the wafer fabrication process after deposition of all dielectric layers at temperatures greater than 500° C. has occurred. In such case the patterned removal of all dielectrics in regions where the bond pad metal is to be deposited should preferably be accomplished immediately prior to bond pad metal deposition. While such patterned dielectric removal can be accomplished by a combination of dry etching and/or wet etching known in the art, it is preferable that the removal of the bottom-most dielectric be accomplished by wet buffered oxide etchant known in the art to leave a clean and flat SiC surface as the foundation for the bond pad stack metal deposition. In one embodiment, the method may include loading the SiC wafer into the vacuum deposition as soon as possible following the final patterned dielectric wet etch.

In one embodiment, the lateral circular diameter of the patterned bond pad metal stack (e.g. the "IrIS" stack) is close to 160 micrometers, but this size can be adjusted to between 40 micrometers and 300 micrometers depending upon the specifications of the wire bonding or flip-chip process being used to make electrical connection to the bond pad.

In some embodiments, the bond pad diameter should be selected large enough for subsequent attachment of robust gold-alloy wires via ball-type wire bonding known in the art. In another embodiment, the lateral bond pad shape may consist of a rounded-corner square-like shape with suitably rounded corners or a rectangular shape with suitably rounded corners. Lateral bond pad shapes with sharp corners are undesirable as sharp corners are known to undesirably enhance/concentrate stress.

In one embodiment, the laterally enclosing metal (e.g., 210, 310) is a lateral extension one of the metal interconnect layer patterns used in the construction of interconnects between transistors within the transistor integrated circuit, with selected material, thickness, and deposition method selected to meet the integrated circuit fabrication requirements. In one embodiment, the laterally enclosing metal is selected to be hollow ring shape that simultaneously desirably minimizes the electrical series resistance of the invention.

In one embodiment, metal interconnect (e.g., 210, 310) may be comprised of $TaSi_2$ that may be deposited by close-proximity sputtering process (target-to-substrate distance of less than 3 cm) and patterned by reactive ion etching and may further include photolithographic patterning to form an enclosing metal pattern (e.g., 210, 310). In one embodiment, the lateral distance between the laterally enclosing metal 210, 310, and bond pad island metal (e.g., 220, 320) is approximately 10 micrometers, which is approximately 1.6× "lambda dimension" of 6 micrometers of this particular process.

In one embodiment, the SiC semiconductor may comprise 4H—SiC with a patterned and thermally activated ion implant of n-type dopant (e.g., nitrogen and/or phosphorous dopants) to increase the electrical conductivity of conductive region of semiconductor 370. (See, e.g., FIG. 3b.) In one embodiment, the dielectric may comprise 1 micrometer thick $SiO_2$ deposited at 720° C. by low-pressure chemical vapor deposition (LPCVD) using tetraethyl orthosilicate (TEOS) precursor.

Figure 5:
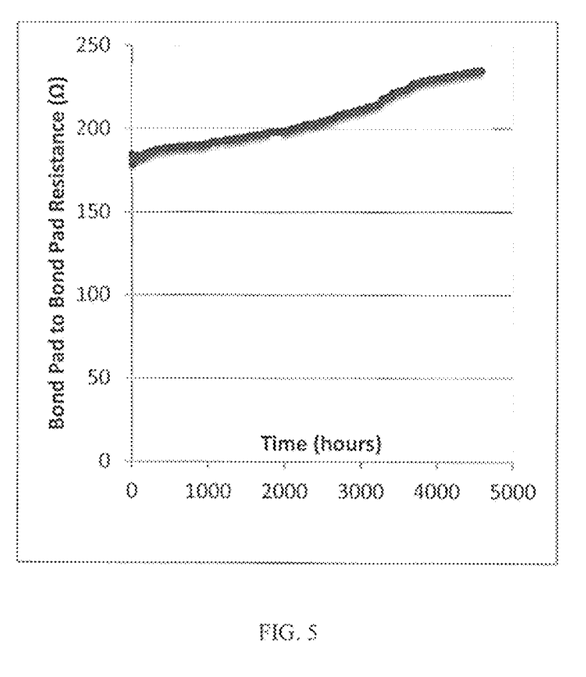
FIG. 5 is a graph depicting an example of experimentally measured bond pad to bond pad resistance over time.

In one embodiment, patterned vias through the $SiO_2$ layer are patterned by dry and wet etching prior to metal $TaSi_2$ deposition to facilitate desired electrical connection between the interconnect metal to the conductive 4H—SiC layer. In one embodiment, a different contacting metal layer can be inserted at the bottom of the via between the TaSi2 and the conductive 4H—SiC layer. The details of a suitable via etch followed by deposition of different contacting metal plus $TaSi_2$ metal into the via are disclosed in U.S. patent application Ser. No. 15/438,130, hereby incorporated in its entirety. Using these processes and the bond pad structure represented in FIG. 2, bond pads were successfully fabricated and shown to electrically function for thousands of hours at 500° C. with little degradation/change in electrical conduction as shown, for example in FIG. 5).

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An apparatus comprising:
a bond pad metal stack having an interface in direct physical, mechanical, and, conductive electrical contact with a surface of a conductive region of a semiconductor, wherein the conductive region of a semiconductor possesses a single doping polarity,
a first insulating dielectric layer comprising a patterned via, wherein the patterned via extends through only the first insulating dielectric layer, wherein the first insulating dielectric layer is in contact with an outside lateral interface of the bond pad metal stack and also in direct contact with the surface of the conductive region of the semiconductor, and
at least one electrically conductive metal layer that is not in physical contact with the bond pad metal stack, but is in electrical and physical contact through the patterned via with the conductive region of the semiconductor,
wherein an electrical signal path flows through the bond pad metal stack, the conductive region of the semiconductor, and through the at least one electrically conductive metal layer that carries electrical signals to/from semiconductor devices and circuits residing elsewhere on the semiconductor.

2. The apparatus of claim 1, further comprising a second upper insulating dielectric layer that overcoats the apparatus, except that a top surface of the bond pad metal stack is devoid of the second upper insulating dielectric layer.

3. The apparatus of claim 1, wherein the first insulating dielectric layer and the second upper insulating dielectric layer comprise different materials.

4. The apparatus of claim 1, wherein the conductive region is below the first insulating dielectric layer.

5. The apparatus of claim 4, wherein the conductive region is a microscopically flat/smooth, mechanically hard, and conductive region of a silicon carbide (SiC) single-crystal semiconductor.

6. The apparatus of claim 1, wherein the conductive region is a conductive SiC layer.

7. The apparatus of claim 1, wherein the bond pad metal stack comprises an iridium interfacial stack ("IrIS") comprising a $TaSi_2$ layer, a lower platinum layer, an iridium layer, and an upper platinum layer.

8. The apparatus of claim 7, wherein a top gold layer is added above the IrIS.

9. The apparatus of claim 7, wherein the $TaSi_2$ layer has a depth of about 400 nm and all other layers of the IrIS have a depth of about 200 nm.

10. The apparatus of claim 1, wherein the at least one electrically conductive metal layer comprises a high temperature refractory metal or metal alloy.

11. The apparatus of claim 10, wherein the at least one electrically conductive metal layer comprises titanium.

12. An apparatus comprising:
a bond pad metal stack having a bottom interface in direct physical, mechanical, and, conductive electrical contact with a surface of a conductive region of a silicon carbide (SiC) single-crystal semiconductor, wherein the conductive region of the SiC single-crystal semiconductor possesses a single doping polarity,
a first insulating dielectric layer comprising a patterned via, wherein the patterned via extends through only the first insulating dielectric layer, wherein the first insulating dielectric layer is in contact with an outside lateral interface of the bond pad metal stack and also in direct contact with the surface of the conductive region of the SiC single-crystal semiconductor,
a second upper insulating dielectric layer that overcoats the apparatus, except that a top surface of the bond pad metal stack is devoid of the second upper insulating dielectric layer, and
at least one electrically conductive metal layer that is not in physical contact with the bond pad metal stack, but is in electrical and physical contact through the patterned via with the conductive region of the SiC single-crystal semiconductor,
wherein an electrical signal path flows through the bond pad metal stack, the conductive region of the SiC single-crystal semiconductor, and through the at least one metal layer that carries electrical signals to/from semiconductor devices and circuits residing elsewhere on the SiC single-crystal semiconductor.

13. The apparatus of claim 12, wherein the first insulating dielectric layer and the second upper insulating dielectric layer comprise different materials.

14. The apparatus of claim 12, wherein the bond pad metal stack comprises an iridium interfacial stack ("IrIS") comprising a $TaSi_2$ layer, a lower platinum layer, an iridium layer, and an upper platinum layer.

15. The apparatus of claim 14, wherein a top gold layer is added above the IrIS.

16. The apparatus of claim 14, wherein the $TaSi_2$ layer has a depth of about 400 nm and all other layers of the IrIS have a depth of about 200 nm.

17. The apparatus of claim 12, wherein the at least one electrically conductive metal layer comprises a high temperature refractory metal or metal alloy.

* * * * *